US005704105A

United States Patent [19]

[11] Patent Number: 5,704,105

Venkataramani et al.

[45] Date of Patent: Jan. 6, 1998

[54] METHOD OF MANUFACTURING MULTILAYER ARRAY ULTRASONIC TRANSDUCERS

[75] Inventors: Venkat Subramaniam Venkataramani, Clifton Park; Douglas Glenn Wildes, Ballston Lake; Robert Stephen Lewandowski, Amsterdam, all of N.Y.

[73] Assignee: General Electric Company, Schenectady, N.Y.

[21] Appl. No.: 707,678

[22] Filed: Sep. 4, 1996

[51] Int. Cl.[6] .................................................... H01L 41/22

[52] U.S. Cl. ......................... 29/25.35; 310/334; 310/336; 367/155

[58] Field of Search .......................... 29/25.35; 310/334, 310/336; 367/155

[56] References Cited

U.S. PATENT DOCUMENTS

| | | | |
|---|---|---|---|
| 4,779,244 | 10/1988 | Horner et al. | 367/140 |
| 4,890,268 | 12/1989 | Smith et al. | 367/138 |
| 4,958,327 | 9/1990 | Saitoh et al. | 367/7 |
| 5,091,893 | 2/1992 | Smith et al. | 367/153 |
| 5,329,496 | 7/1994 | Smith | 367/140 |
| 5,381,385 | 1/1995 | Greenstein | 367/140 |

OTHER PUBLICATIONS

S. Saithoh, M. Izumi, and K. Abe, "A Low-Impedance Ultrasonic Probe Using a Multilayer Piezoelectric Ceramic," Japan J. Appl. Phys., vol. 28, suppl. 28-1, pp. 54-56, 1989.

R.L. Goldberg and S.W. Smith, "Performance of Multilayer 2-D Transducer Arrays," Proceedings of the IEEE Ultrasonics Symposium, pp. 1103-1106, 1993.

M. Greenstein and U. Kumar, "Multilayer Peizoelectric Resonators for Medical Ultrasound Transducers," IEEE Transactions On Ultrasonics, Ferroelectrics, and Frequency Control, vol. 43, No. 4, Jul. 1966.

*Primary Examiner*—Carl E. Hall
*Attorney, Agent, or Firm*—Marvin Snyder

[57] ABSTRACT

A method for fabricating "1.5D" and "2D" multilayer ultrasonic transducer arrays employs dicing saw kerfs, which provide acoustic isolation between rows. The kerfs are metallized to provide electrical connection between surface electrode layers and buried internal electrode layers. A multilayer piezoceramic transducer element for a "1.5D" or "2D" array produced by this method has higher capacitance, and accordingly provides better transducer sensitivity, in comparison to a single layer element.

12 Claims, 10 Drawing Sheets

METHOD OF MANUFACTURING MULTILAYER ARRAY ULTRASONIC TRANSDUCERS

BACKGROUND OF THE INVENTION

This invention relates to phased array ultrasonic transducers and, more particularly, to two-dimensional arrays of multilayer transducer elements.

Array ultrasonic transducers, employed for example in medical applications, rely on wave interference for their beam forming effects, and typically employ a plurality of individual transducer elements organized as either a one-dimensional (linear) array or a two-dimensional array. Ultrasound is used as a non-invasive technique for obtaining image information about the structure of an object which is hidden from view, and has become widely known as a medical diagnostic tool. Ultrasound is also used for non-destructive testing and analysis in the technical arts. Medical ultrasonic transducer arrays typically operate at a frequency within the range of one MHz to ten MHz, although higher frequencies are certainly possible.

Medical ultrasonic transducer arrays conventionally are fabricated from a block of ceramic piezoelectric material within which individual elements are defined and isolated from each other by sawing at least partially through the block of piezoelectric material, making a number of cuts with a dicing saw.

In the fabrication of a two-dimensional array, as a preliminary step a dicing saw is employed to make several row isolation cuts or slots (for example from three to eight isolation cuts) most of the way through the block of piezoelectric material to define isolated rows or subarrays. Subsequently, a second series of many (for example approximately 128) dicing saw cuts are made at right angles to the row isolation cuts or slots, typically all the way through the block of piezoelectric material, to define individual piezoelectric transducer elements within each row or subarray. Each resultant piezoelectric transducer element is acoustically and electrically isolated from its neighbors.

More particularly, conventional one-dimensional ("1D") ultrasound transducers comprise a single row of transducer elements. The width and pitch of the elements along the row are relatively fine (one-half to two wavelengths of sound in water), allowing dynamic electronic beam forming (steering and focusing) along the azimuthal axis. The elevational aperture is many wavelengths in extent, and is not subdivided. A fixed-focus cylindrical lens controls the elevational thickness of the ultrasound beam.

To obtain dynamic electronic control of the elevational properties of the beam, the transducer may be subdivided into several rows. If the elevational pitch approaches an acoustic wavelength, one obtains a "2D" transducer, capable of electronic steering and focusing in both azimuth and elevation. If, however, the elevational pitch remains large, the result is a "1.5D" transducer with the capability of electronic focusing, but not beam steering, in the elevation direction.

As the transducer aperture during design is subdivided from a "1D" to a "1.5D" or "2D" design, the area of the individual transducer elements is dramatically reduced, while other system components such as coaxial cable, multiplexer and preamplifier remain the same. As the transducer elements become smaller, their electrical impedance increases, adversely affecting both transmit and receive performance due to impedance mismatch with conventional circuitry. Particularly in receive mode, a high impedance transducer element has decreased ability to effectively drive conventional coaxial cable and connected electronics. The higher element impedance thus results in an overall loss of sensitivity which can partially offset the advantages of the "1.5D" or "2D" transducer architecture.

One strategy for overcoming this increase in impedance and loss of sensitivity is to increase the capacitance of the individual piezoelectric elements. Improvements by a factor of two may be obtained by using piezoceramic materials with high dielectric constant (for example, PZT-5H with $\epsilon/\epsilon_0$=6500 versus conventional PZT-5H with $\epsilon/\epsilon_0$=3300).

Improvement by larger factors requires the use of multilayer ceramics, as described for example by S. Saitoh, M. Izumi, and K. Abe, "A Low-Impedance Ultrasonic Probe Using a Multilayer Piezoelectric Ceramic," *Japan J. Appl. Phys.*, vol. 28, suppl. 28-1, pp. 54–56, 1989; R. L. Goldberg and S. W. Smith, "Performance of Multilayer 2-D Transducer Arrays," *Proceedings of the IEEE Ultrasonics Symposium*, pp. 1103–1106, 1993; M. Greenstein and U. Kumar, "Multilayer Piezoelectric Resonators For Medical Ultrasonic Transducers," *IEEE Transactions on Ultrosonics, Ferroelectrics, and Frequency Control*, Vol 43, pp. 620–622, 1996; and Saitoh et al. U.S. Pat. No. 4,958,327. An n-layer ceramic transducer element has a set of alternating internal electrodes connected to one polarity, and another set of electrodes connected to the opposite polarity. Piezoceramic layers are accordingly acoustically connected in series and electrically connected in parallel. When the thickness of a multilayer ceramic element is equal to that of a single-layer ceramic element, both elements have the same resonant frequency. However, the impedance of the multilayer element is $1/n^2$ that of the single-layer ceramic element. Thus, the capacitance of a multilayer piezoelectric transducer element is increased by the square of the number of layers, so a three-layer element for example has an electrical impedance which advantageously is nine times lower than the impedance of a comparable single-layer element.

The use of multilayer piezoceramic materials however introduces another problem, that of making electrical connection to the internal electrodes. For a "1D" transducer, the outer edges of the finished electrodes can be metallized to electrically connect the internal and external electrodes, as is also disclosed in the Saitoh et al. paper identified above. A "1D" array is diced in only one direction, so each element has two uncut edges, one each for connecting to the internal signal and ground electrodes.

The situation is not so straightforward in the case of a "1.5D" or a "2D" array. The piezoceramic and electrodes of a "1.5D" or "2D" array must be divided or diced in two directions to isolate each element from its neighbors, precluding the edge metallization approach of Saitoh et al.

A multilayer "1.5D" array could be built by carefully assembling several pieces of "1D" multilayer piezoceramic, one piece for each elevational row. Row-to-row isolation would be provided by gaps left during assembly. Column-to-column isolation would be obtained by dicing. Each element would be left with two uncut edges to provide the necessary electrode connections. However, the pick-and-place accuracy requirements are near the current state of the art and cause the process to be expensive and not competitive.

Another approach to making the necessary internal electrode connections is described in the above-cited paper by R. L. Goldberg and S. W. Smith, "Performance of Multi-Layer 2-D Transducer Arrays," *Proceedings of the IEEE Ultrasonics Symposium*, pp. 1103–1106, 1993; in S. W. Smith U.S. Pat. No. 5,329,496; and in M. Greenstein, U.S. Pat. No. 5,381,385. In that approach, an array of vias is built into the multilayer piezoceramic body. Final dicing is aligned with the vias so as to leave each transducer element with connections to both its ground and signal internal electrodes. A disadvantage of this method is that the vias increase the difficulty and cost of making the multilayer ceramic. In particular, it is very difficult to make very small vias (i.e., smaller than 75 microns) which are precisely aligned from one layer to the next. Further, neither this nor the pick-and-place assembly method result in a ground electrode which is continuous across one face of the multilayer piezoceramic body.

Thus there remains a need for a technique to provide compact electrical connections between the external and internal electrodes of a multilayer "1.5D" or "2D" ultrasonic transducer array.

SUMMARY OF THE INVENTION

Accordingly, an object of the invention is to provide a method for fabricating multilayer piezoceramic for "1.5D" and "2D" ultrasound transducer arrays, allowing production of higher quality parts at a lower cost.

Another object of the invention is to provide a method and resultant structure for making electrical connections to the inner electrode layers of multilayer ultrasonic transducer elements.

Yet another object of the invention is to provide such method which is compatible with existing fabrication methods for two-dimensional ultrasonic array transducers.

Briefly, in accordance with an overall aspect of the invention, dicing saw kerfs, required for acoustic isolation between rows in any event, are metallized to provide electrical connection between surface electrode layers and buried internal electrode layers.

As an initial step of a method for manufacturing an array of multilayer ultrasonic transducer elements, a multilayer piezoceramic body with internal electrodes is provided. The body has two major surfaces, and an internal buried conductor layer structure. The buried conductor layer structure includes at least one ground conductor layer comprising a set of generally planar buried ground electrode precursors extending in a first coordinate direction, for example along the azimuth axis, and spaced in a perpendicular second coordinate direction, for example along the elevational axis, and at least one signal conductor layer comprising a set of generally planar buried signal electrode precursors likewise extending in the first coordinate direction (for example along the azimuth axis) and spaced in the second coordinate direction (along the elevational axis). The buried signal electrode precursors are staggered in the second coordinate direction (in this example, along the elevational axis) with reference to the buried ground electrode precursors such that intermediate regions of the buried signal electrode precursors are in alignment with spaces between the buried ground electrode precursors, and intermediate regions of the buried ground electrode precursors likewise are in alignment with spaces between the buried signal electrode precursors.

Employing a dicing saw, a first set of partial depth row isolation slots are formed, extending from one of the major surfaces into the body in alignment with spaces between buried ground electrode precursors and intersecting buried signal electrode precursors, thus defining buried signal electrode portions on either side of each of the first set of row isolation slots. Likewise, a second set of partial depth row isolation slots extending from the other major surfaces into the body is formed in alignment with spaces between buried signal electrode precursors and intersecting buried ground electrode precursors, thus defining buried ground electrode portions on either side of each of the second set of row isolation spots.

A signal electrode layer is formed, such as by metallizing, on the one of the major surfaces, and the row isolation slots of the first set are internally metallized to form buried signal electrode signal access conductors electrically connecting the buried signal electrodes to the signal electrode layer. Similarly, a ground electrode layer is formed on the other of the major surfaces, and the row isolation slots of the second set are internally metallized to define buried ground electrode access conductors electrically connecting the buried ground electrodes to the ground electrode layer.

The signal electrode layer is patterned to define isolated row signal electrodes, and at least some of the buried signal electrode access conductors are patterned to electrically isolate the buried signal electrode portions on opposite sides of the row isolation slots of the first set.

A variety of patterning techniques can be employed, such as making appropriate cuts with a dicing saw. As an alternative, particularly for patterning at the bottom of the first set of row isolation slots on the signal electrode side, a string saw may be employed, positioned in the bottom of the row isolation slots prior to starting the saw, thus avoiding the risk of damage to metallization on the sides of the slots. As another alternative, a wire mask may be placed prior to metallization, and subsequently removed.

As a final step, the body is diced in the second coordinate direction, that is with dicing cuts parallel to the elevational axis, to define a plurality of individual elements in each row extending along the azimuth axis.

The invention also provides a corresponding transducer array device which has two major surfaces and includes a plurality of multilayer transducer elements arranged in a two-dimensional array of rows and multiple elements in each row. Each transducer element has an external signal electrode on one surface corresponding to one of the array major surfaces, and an external ground electrode on an opposite surface corresponding to the other of the array major surfaces. Each transducer element has an odd number of piezoelectric material layers separated by at least one internal signal electrode defining with the external signal electrode a set of signal electrodes, and at least one internal ground electrode defining with the external ground electrode a set of ground electrodes. The signal electrodes alternate with the ground electrodes.

Extending from one of the array major surfaces is a first set of partial depth row isolation slots intersecting the transducer element internal signal electrodes and not intersecting the transducer element internal ground electrodes. Conductive material, such as metallization, in the first set of partial depth row isolation slots electrically connects the internal signal electrode or electrodes of each transducer element to the corresponding external signal electrode. A second set of partial depth row isolation slots extends from the other of the array major surfaces, intersecting the transducer element internal ground electrodes and not intersecting the transducer element internal signal electrodes. Conductive material, such as metallization, in the second set of partial depth row isolation slots electrically connects the internal ground electrodes to the external ground electrodes. The multiple elements of each row are defined by a set of dicing cuts perpendicular to the row isolation slots.

BRIEF DESCRIPTION OF THE DRAWINGS

The features of the invention believed to be novel are set forth in the appended claims. The invention, however, together with further objects and advantages thereof, may best be understood by reference to the following description taken in conjunction with the accompanying drawing(s) in which:

DETAILED DESCRIPTION

Figure 1:
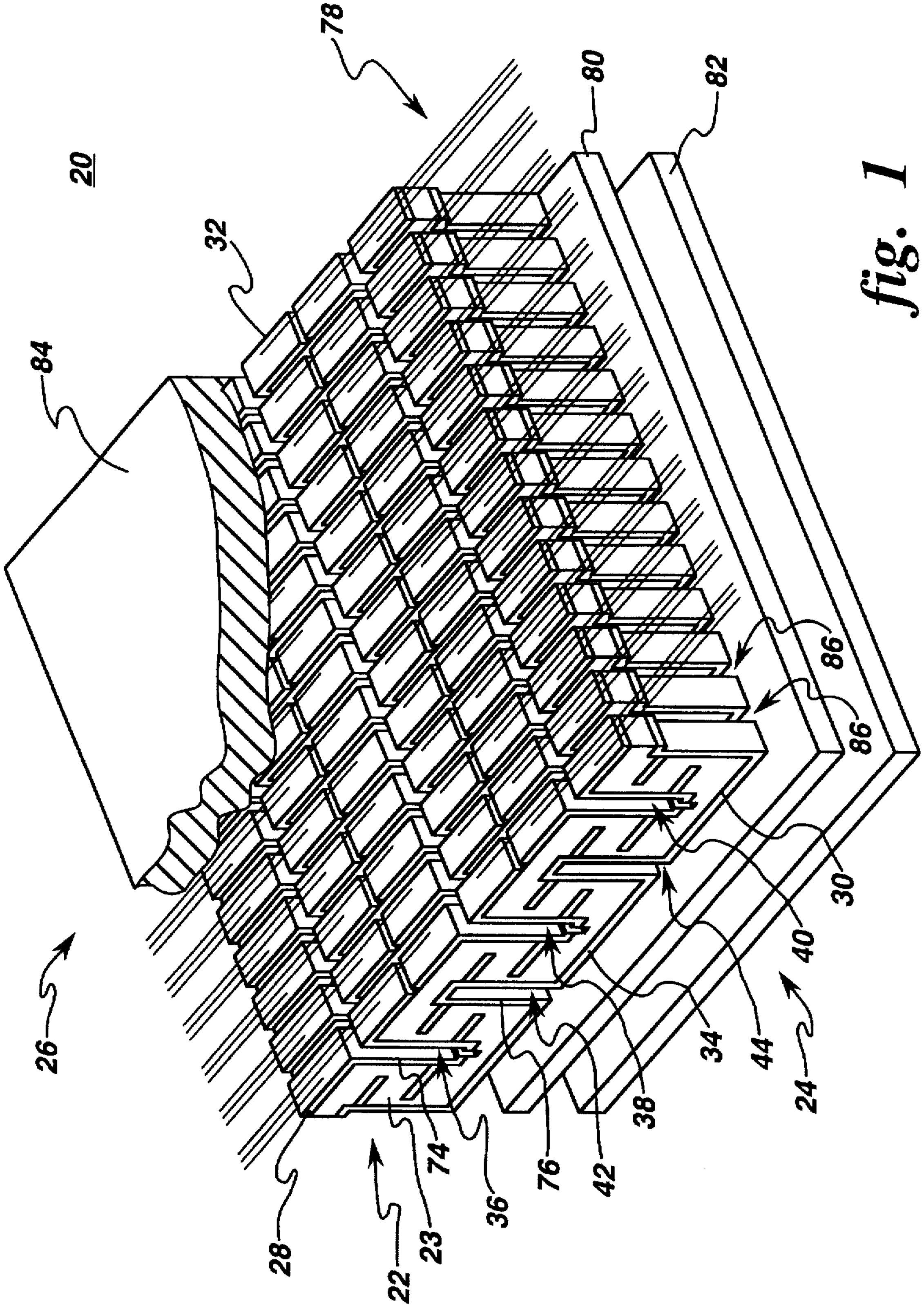
FIG. 1 is an exploded, three-dimensional, partially schematic representation of an ultrasonic transducer including an array in accordance with the invention, with signal electrode leads and acoustic matching layers attached.
Figure 2:
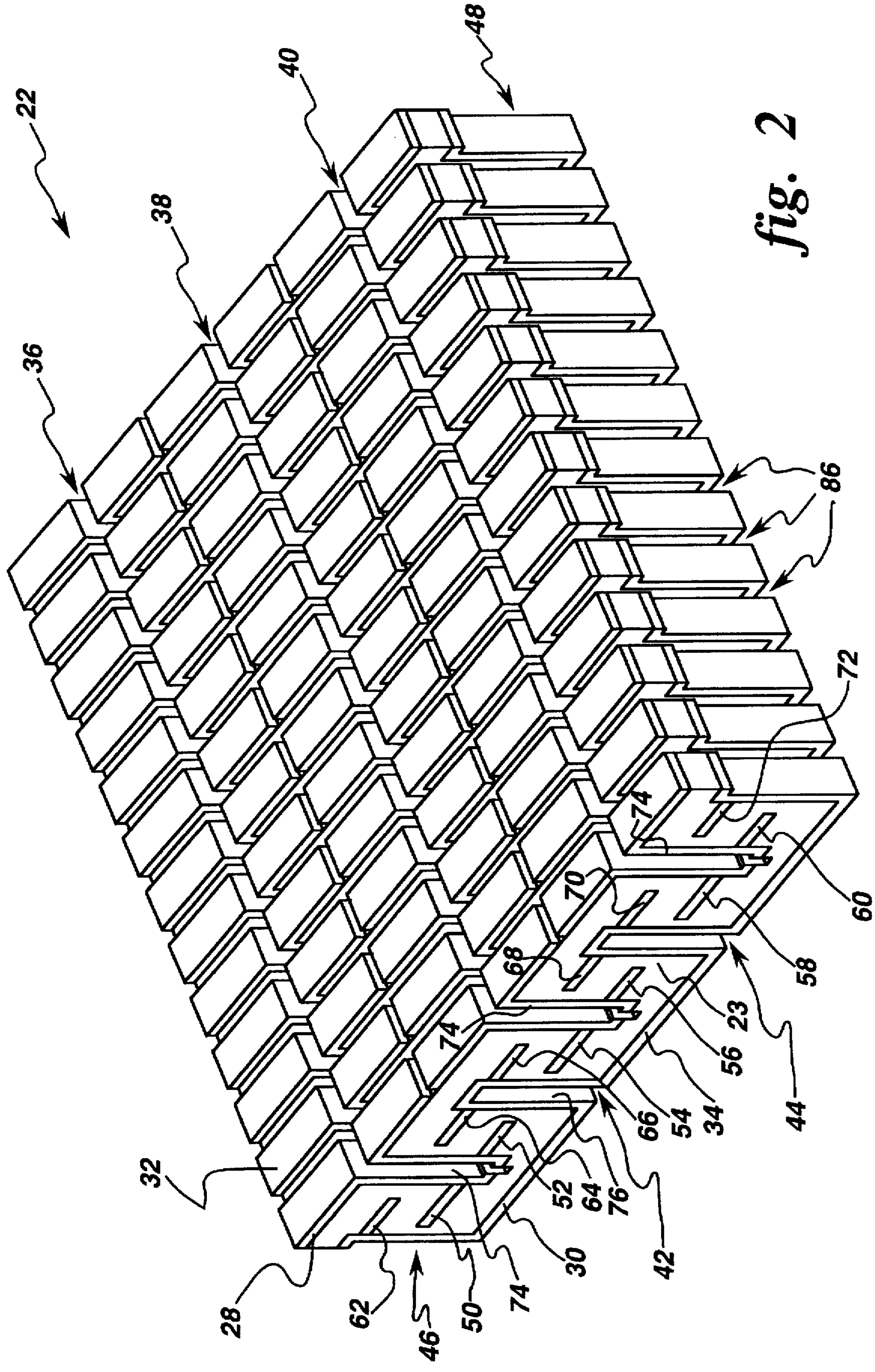
FIG. 2 is an enlarged three-dimensional view of the array portion of the transducer of FIG. 1 in isolation.

FIG. 1 is a three-dimensional somewhat schematic exploded representation of a "1.5D" ultrasonic transducer 20 fabricated generally as taught by L. S. Smith et al. in U.S. Pat. No. 5,091,893, the entire disclosure of which is hereby expressly incorporated by reference, but including a multilayer array 22 in accordance with the invention. FIG. 2 is an enlarged three-dimensional view of array 22 in isolation. In the orientation of FIG. 1, the "front" or active side 24 of transducer 20 is at the bottom, and the "back" side of 26 of transducer 20 is at the top.

As shown in FIGS. 1 and 2, array 22 comprises a body 23 of piezoelectric material having two major surfaces 28 and 30, with patterned signal electrode metallization 32 on surface 28, and ground electrode metallization 34 on surface 30. By way of example, piezoelectric material body 23 may be 35 mm long by 20 mm wide with a thickness of 0.35 mm. It will be appreciated that the scale and proportions of array 22 in FIGS. 1 and 2, as well as in the other FIGS. herein, are distorted for purposes of illustration, including an exaggeration in thickness. Thus an individual array element typically has a thickness of 0.35 mm (comprising three 0.12 mm layers), a width of 0.20 mm along the azimuth axis, and a length of 3.3 mm along the elevational axis.

A first set of partial depth row isolation slots 36, 38 and 40 extend from major surface 28, and a second set of partial depth row isolation slots 42 and 44 extend from major surface 30 into the body 22. These row isolation slots 36, 38, 40, 42 and 44 all extend in a first coordinate direction, for example along the azimuth axis of transducer 20, in this example defining six isolated rows or subarrays within piezoelectric material body 23. Although not shown, for simplicity of illustration, those skilled in the art will recognize that dicing cuts also extend in alignment with slots 86 from the front side 24 through acoustic matching layers 80 and 82 and through the piezoelectric material of body 23.

In addition to their conventional function of providing acoustic isolation, row isolation slots 36, 38 and 40 also provide access for purposes of electrical connection to buried signal electrodes 50, 52, 54, 56, 58 and 60, and row isolation slots 42, 44, 46 and 48 provide access for purposes of electrical connection to buried ground electrodes 62, 64, 66, 68, 70 and 72. More particularly, within each of row isolation slots 36, 38 and 40, metallization 74 serves as a buried signal electrode access conductor, and within each of row isolation slots 42 and 44, metallization 76 serves as a buried ground electrode access conductor.

An interconnect structure 78, shown schematically in FIG. 1, makes individual external connections to the various signal electrodes 32 and, through buried signal electrode access conductors 74, to corresponding buried signal electrodes 50, 52, 54, 56, 58 and 60.

Suitable interconnect structures 78 are disclosed in the above L. S. Smith et al. Pat. No. 5,091,893, as well as in Wildes et al. application Ser. No. 08/570,223, filed Dec. 11, 1995, the entire disclosure of which is also hereby expressly incorporated by reference. Very briefly, and as disclosed in U.S. Pat. No. 5,091,893 and application Ser. No. 08/570,223, a flex circuit comprised of a dielectric substrate (not shown), such as Kapton® polyimide dielectric film having a thickness of between 0.001 and 0.003 inches (25 to 75 microns) supports a plurality of physically parallel signal conductors corresponding to the depicted interconnect conductors 78, terminating in via-holes through which electrical connections to signal electrodes 32 are made. Interconnect structure 78 may either be fabricated directly on a metallized surface of the piezoelectric material of array 22, or may be formed separately and subsequently laminated to the metallized surface of the piezoelectric material of array 22.

To complete the structure of ultrasonic transducer 20, acoustic matching layers 80 and 82 are laminated to the metallization of metallized surface 30 on active side 24. Matching layer 80 comprises graphite, is electrically conductive, and accordingly serves also to make a signal ground electrical connection to ground metallization 34. Matching layer 82 comprises a plastic, such as acrylic. As part of final transducer assembly, subsequent to dicing to define individual piezoelectric elements in each row, a suitable acoustic lens (not shown) is attached to matching layer 82.

On back side 26 an acoustic absorber 84 is formed, for example an epoxy-based mixture approximately 5 mm thick. A suitable absorber 84 material is disclosed in Horner et al. U.S. Pat. No. 4,779,244. Acoustic absorber 84 also serves to provide structural integrity, particularly after dicing to form individual array elements within each row. Thus there are a plurality of dicing cuts 86, extending in the second coordinate direction (for example, parallel to the elevational axis of array 22), all the way through the piezoelectric material body, providing electrical and acoustic isolation along the azimuthal axis. Without absorber 84 and related structures, individual array elements would not be held reliably in position. Advantageously, ground electrode 34 is continuous across surface 30 corresponding to active face 24 of the transducer, and part way up the sides.

Figure 3:
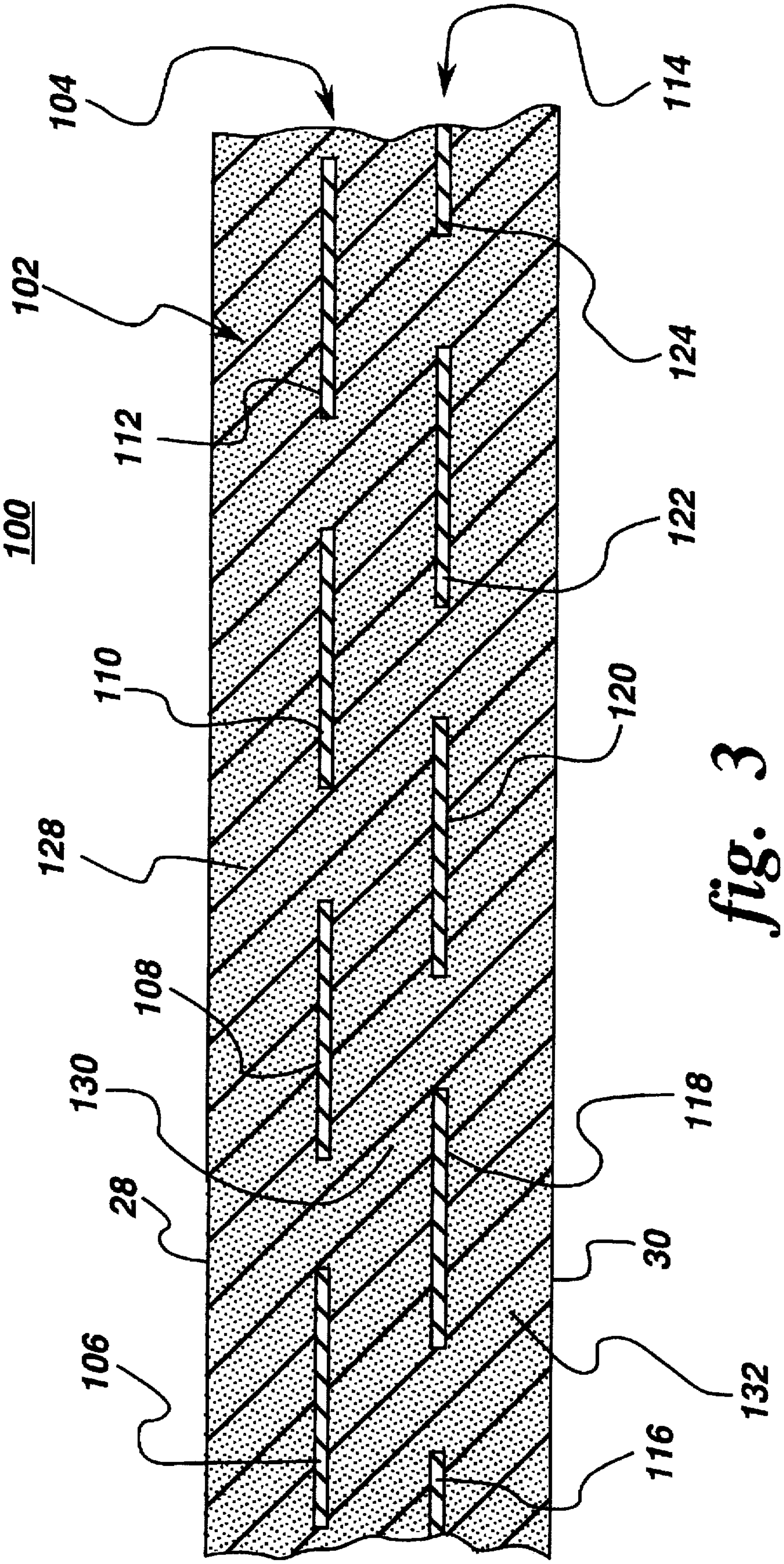
FIG. 3 is a cross-sectional view of a multilayer piezoceramic body with internal electrodes provided during an initial step in the fabrication method of the invention.

FIG. 3 is a cross-sectional view of a multilayer piezoceramic body 100, with internal electrodes, formed as an initial step in a method for making array 22 of FIGS. 1 and 2. The cross-sectional structure of FIG. 3 is maintained over the entire length of body 100 (perpendicular to the drawing sheet), along the azimuth axis of the completed array 22. It will be appreciated that fabrication of the FIG. 3 structure requires patterning and alignment of internal electrodes, but does not require vias.

More particularly, body 100 between major surfaces 28 and 30 has an internal buried conductor layer structure, generally designated 102, including a ground conductor layer 104 comprising a set of generally planar buried ground electrode precursors 106, 108, 110 and 112 extending in the first coordinate direction (for example, along the azimuth axis) and spaced in the second coordinate direction, (for example, along the elevational axis). In addition, structure 102 includes a signal conductor layer 114 comprising a set of generally planar buried signal electrode precursors 116, 118, 120, 122 and 124, likewise extending in the first coordinate direction and spaced in the second coordinate direction. Buried signal electrode precursors 116, 118, 120, 122 and 124 are staggered in the second coordinate direction with reference to buried ground electrode precursors 106, 108, 110 and 112 such that intermediate regions of buried signal electrode precursors 118, 120 and 122 are in alignment with spaces between buried ground electrode precursors 106, 108, 110 and 112, and intermediate regions of buried ground electrode precursors 106, 108, 110 and 112 likewise are in alignment with spaces between buried signal electrode precursors 116, 118, 120, 122 and 124.

Body 100 is thus divided by electrode layers 104 and 114 into three piezoceramic layers 128, 130 and 132. While three piezoceramic layers 128, 130 and 132 are illustrated, it will be appreciated that this is for purposes of example, as the invention is applicable to any such structure which includes an odd number of piezoelectric material layers 128, 130 and 132.

Multilayer structure 100 can be prepared using standard multilayer capacitor forming methods such as tape casting and laminating, screen printing, or waterfall casting on a substrate plate. For example, a three layer body 100 with two internal electrode layers 104 and 114 is prepared by the waterfall casting method to have the required thickness of the middle layer 130 and an excess of thickness on top and bottom layers 128 and 132. Top and bottom layers 128 and 132 are then ground and lapped to achieve the desired final thickness of array 22. Alternatively, multilayer structure 100 can be fabricated by the tape casting method which comprises casting ceramic tape, screen printing the required electrode patterns on sheets of the tape, and laminating several electroded and unelectroded sheets.

Figure 4:
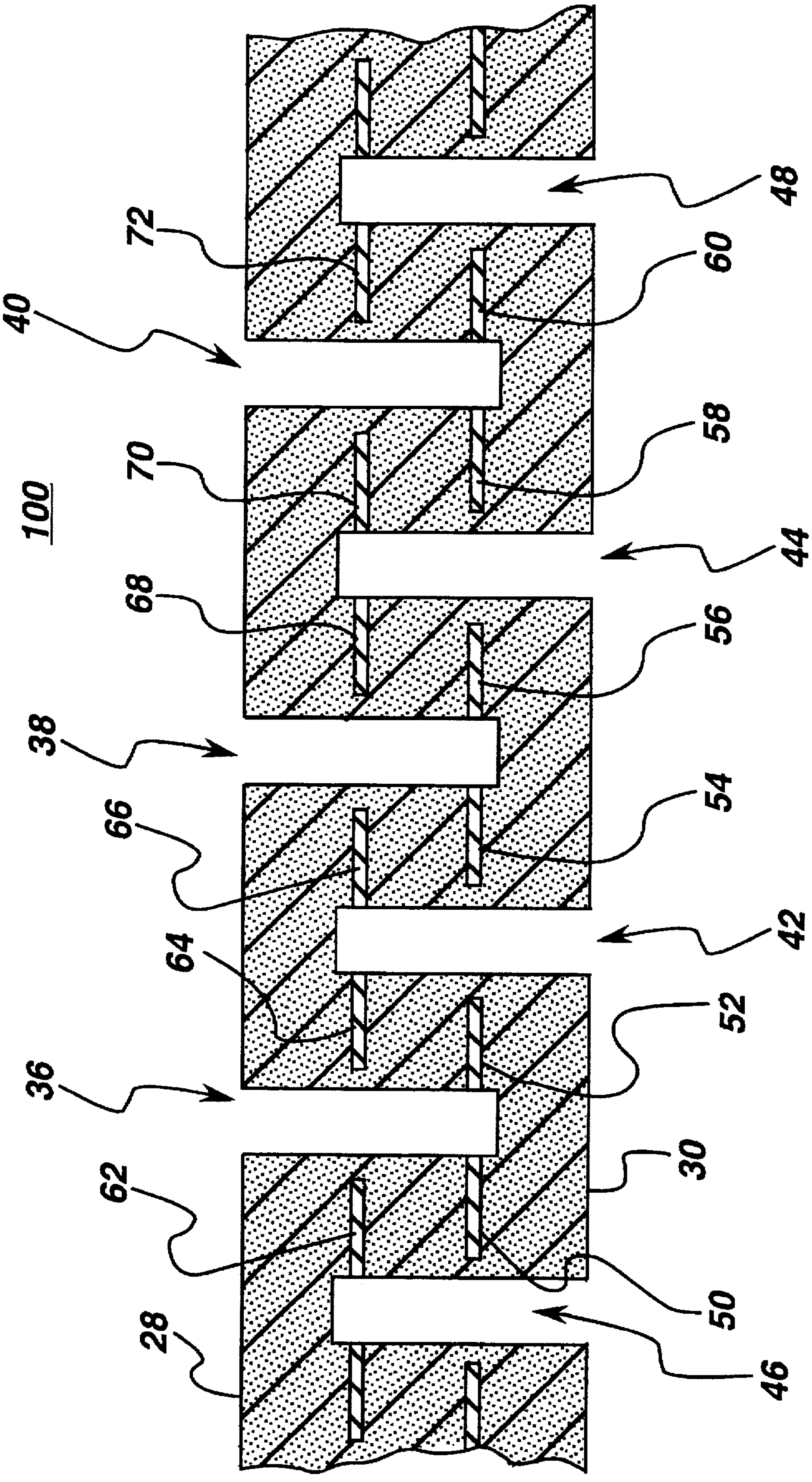
FIG. 4 is a cross-sectional view of the multilayer piezoceramic body of FIG. 3 after row isolation dicing saw cuts have been made from both sides.

FIG. 4 illustrates the result of row isolation saw cuts to form, from surface 28 into body 100, a first set of partial depth row isolation slots 36, 38 and 40, in alignment with spaces between buried ground electrode precursors 106, 108, 110 and 112 (FIG. 3), and intersecting buried signal electrode precursors 118, 120 and 122 to define buried signal electrode portions 50, 52, 54, 56, 58 and 60 (FIG. 4); and to form, from opposite surface 30 into body 100, a second set of representative row isolation slots 42, 44, 46 and 48 in alignment with spaces between buried signal electrode precursors 116, 118, 120, 122 and 124 (FIG. 3) and intersecting buried ground electrode precursors 106, 108, 110, 112 (FIG. 3) to defined buried ground electrode portions 62, 64, 66, 68, 70 and 72 (FIG. 4).

Figure 5:
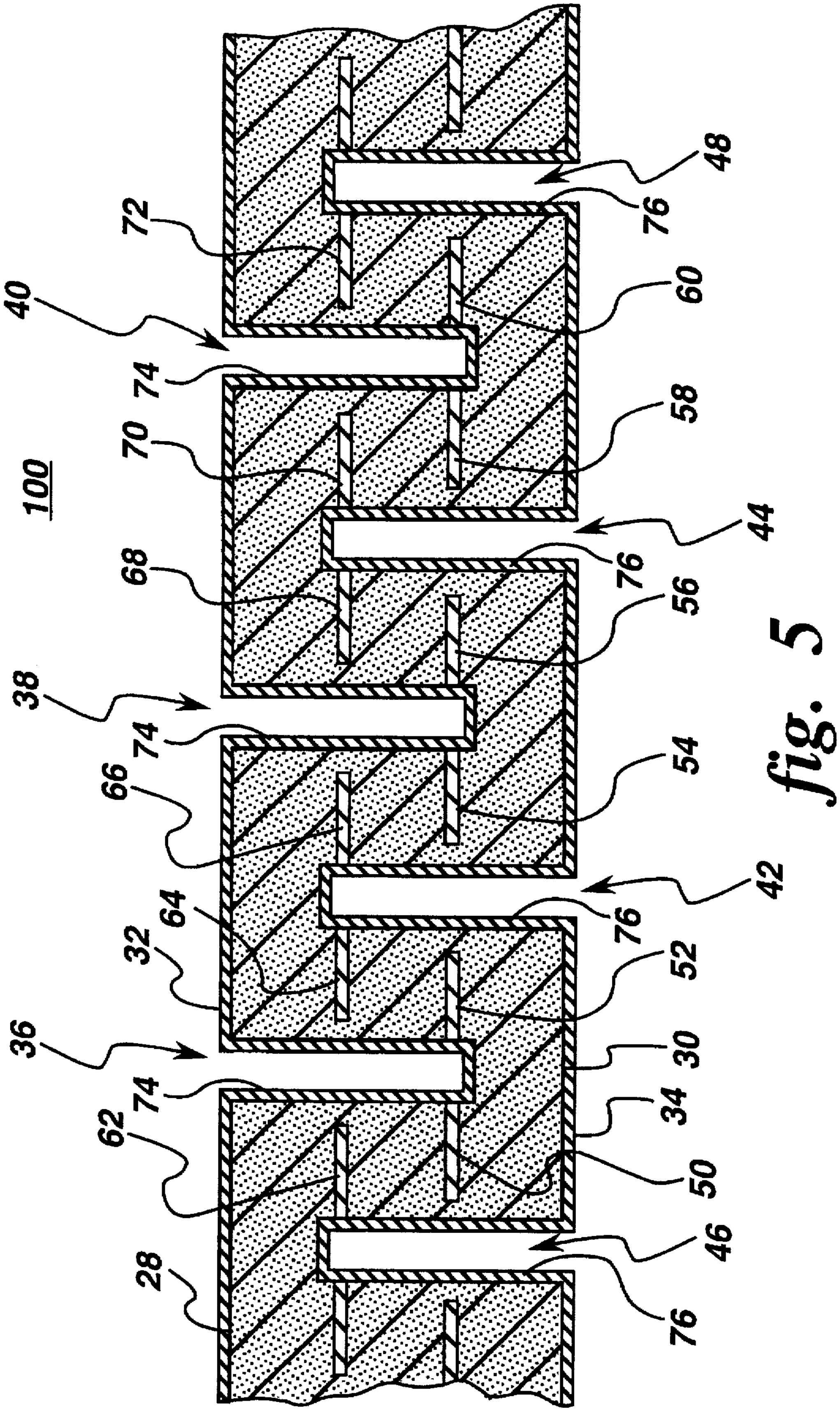
FIG. 5 depicts, in cross-section, a further step in the fabrication method, after the piezoceramic body has been metallized.

FIG. 5 depicts the results of metallization to form signal electrode layer 32 on surface 28 and ground electrode layer 34 on surface 30. Metallization can be accomplished by sputtering, or by electroless plating, electroplating, or a combination of electroless plating and electroplating. Preferably at the same time, row isolation slots 36, 38, 40, 42, 44, 46 and 48 are internally plated. This internal plating forms buried signal access conductors 74 in the first set of row isolation slots 36, 38 and 40 electrically connecting buried signal electrodes 50, 52, 54, 56, 58 and 60 to signal electrode layer 32; and forms buried ground electrode access conductors 76 within the second set of row isolation slots 42, 44, 46 and 48 electrically connecting buried ground electrodes 62, 64, 66, 68, 70 and 72 to ground electrode layer 34. If the aspect ratio of row isolation saw cuts 36, 38, 40, 42, 44, 46 and 48 is such that it is difficult to achieve a uniform coating of their walls, slots 36, 38, 40, 42, 44, 46 and 48 may be filled with a conductive material, such as silver epoxy, either before or after surfaces 28 and 30 are metallized.

Figure 6:
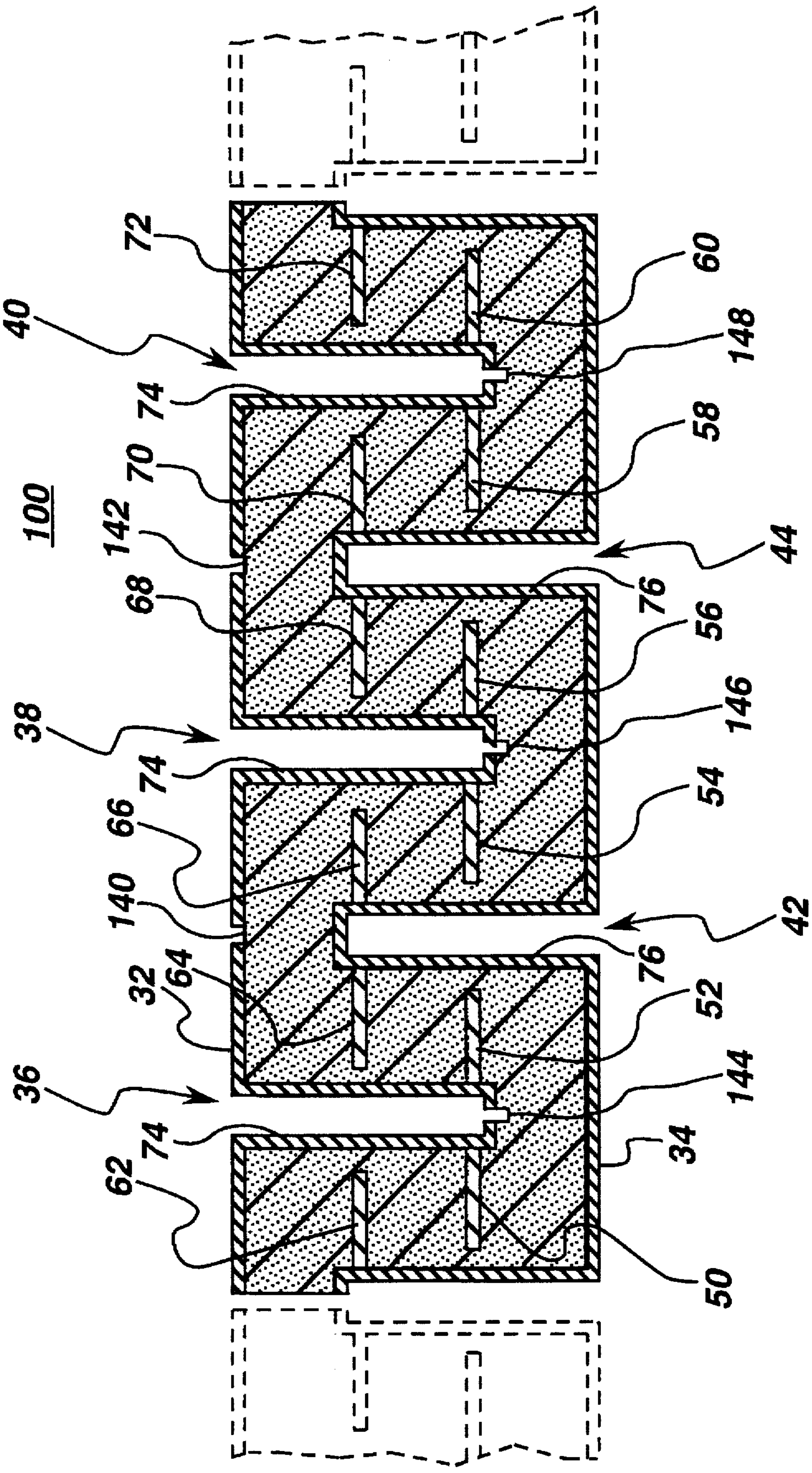
FIG. 6 is a cross-sectional view and FIG. 7 is a corresponding three-dimensional view of the piezoceramic body after isolation saw cuts have been made, and the body trimmed to its final dimensions.
Figure 7:
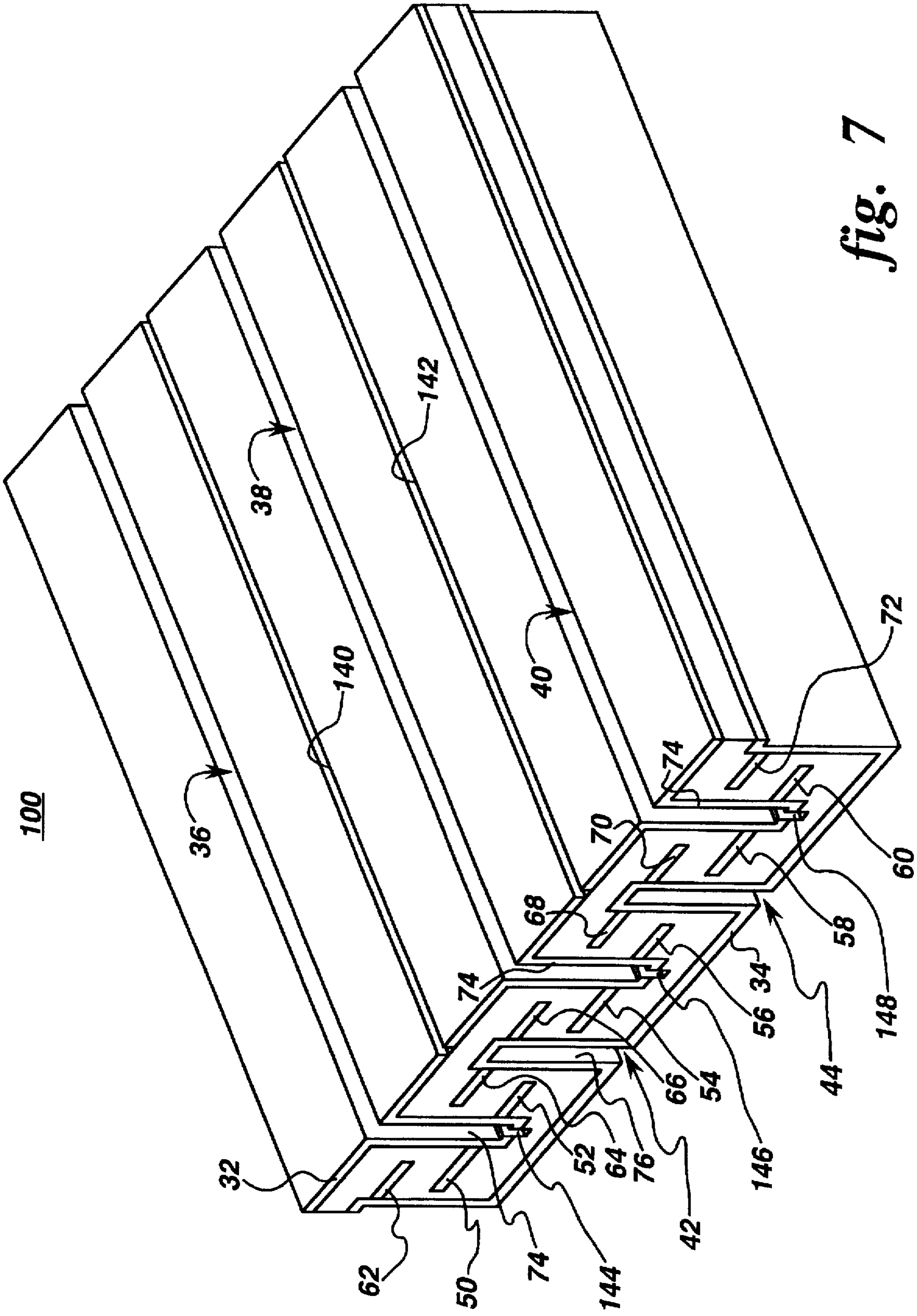

FIGS. 6 and 7 together show body 100 after signal electrode layer 32 has been patterned to define isolated row signal electrodes, at least some of the buried signal electrode access conductors 74 have been patterned, and body 100 has been trimmed to its final elevational dimensions. All of the cuts shown in FIGS. 6 and 7 are made with a diamond wheel dicing saw from the signal electrode 32 side, which is the top in the orientation of FIGS. 6 and 7.

More particularly, dicing saw cuts 140 and 142 are made in signal electrode layer 32 along the azimuth direction to define patterning. Although cuts 140 and 142 are illustrated as cutting away portions of electrode layer 32 only, it will be appreciated that typically a slight cut into piezoceramic body 100 occurs at each location of cuts 140 and 142.

To isolate signal electrodes 50 and 52, 54 and 56, and 58 and 60 on either side of slots 36, 38 and 40, bottom cuts 144, 146 and 148 are made in slots 36, 38 and 40. These bottom cuts must be made carefully to ensure that metallization at the bottom of each of slots 36, 38 and 40 is severed, while metallization 74 along the sides of slots 36, 38 and 40 remains continuous. Rather than using a dicing saw for making isolation cuts 144, 146 and 148, a string saw may be employed. String saw wire is placed at the bottoms of slots 36, 38 and 40 before running the saw, so as to avoid damaging the walls. Use of a string saw involves less critical alignment tolerances than use of a diamond wheel dicing saw. Cuts 140 and 142 to pattern the signal electrode metallization 32 are relatively shallow, and the tolerances are less critical. It will be appreciated that if the ultrasound beam is not to be steered in the elevation direction, then the signals applied to transducer 20 are symmetrical about the center, and center cut 146 is optional.

If arcing occurs between adjacent signal electrodes 50 and 52, 54 and 56, and 58 and 60, isolation slots 36, 38 and 40 may be filled with an acoustically soft material which has a high electrical breakdown threshold, such as silicone rubber.

As a final step, the structure of FIG. 6 is assembled into the ultrasonic transducer of FIGS. 1 and 2, producing the finished "1.5D" multilayer piezoceramic.

Figure 8:
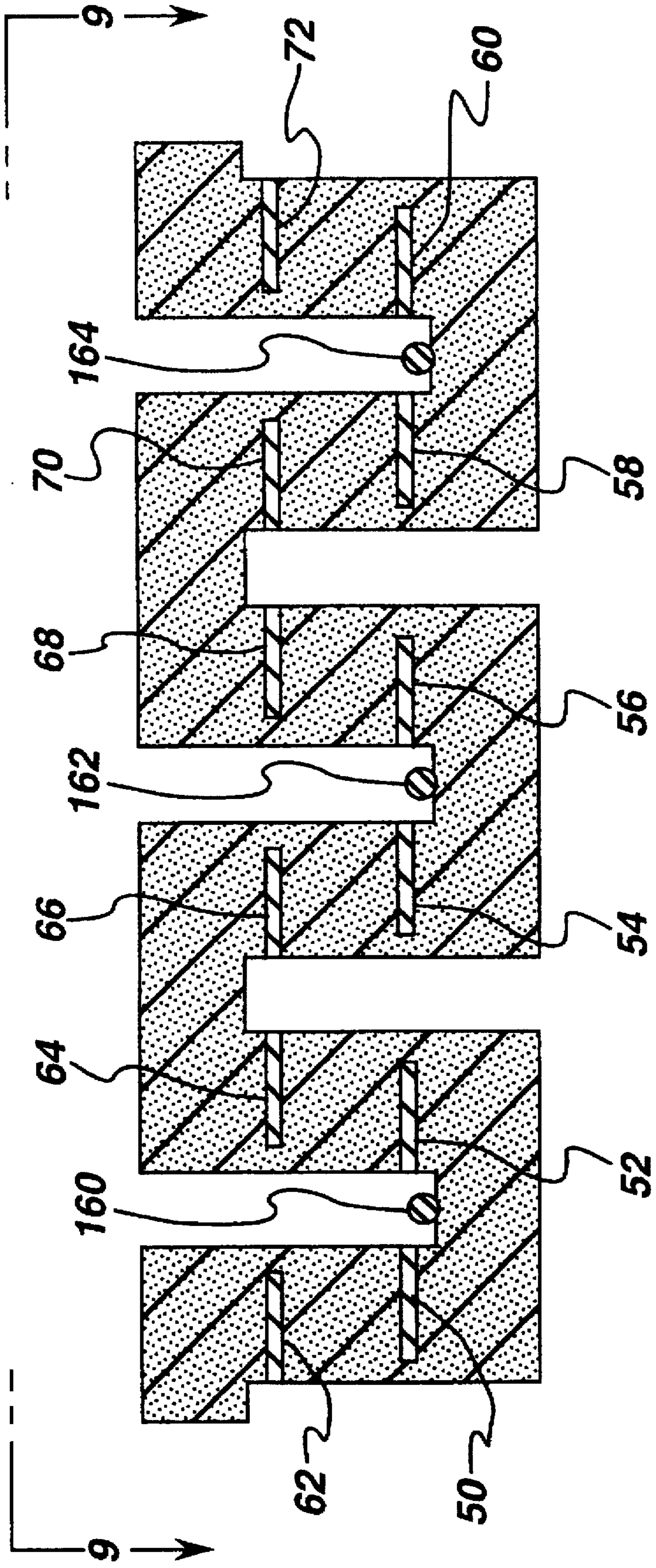
FIG. 8 is a cross-sectional view depicting a masking technique as an alternative to the method depicted in FIGS. 5 and 6.
Figure 9:
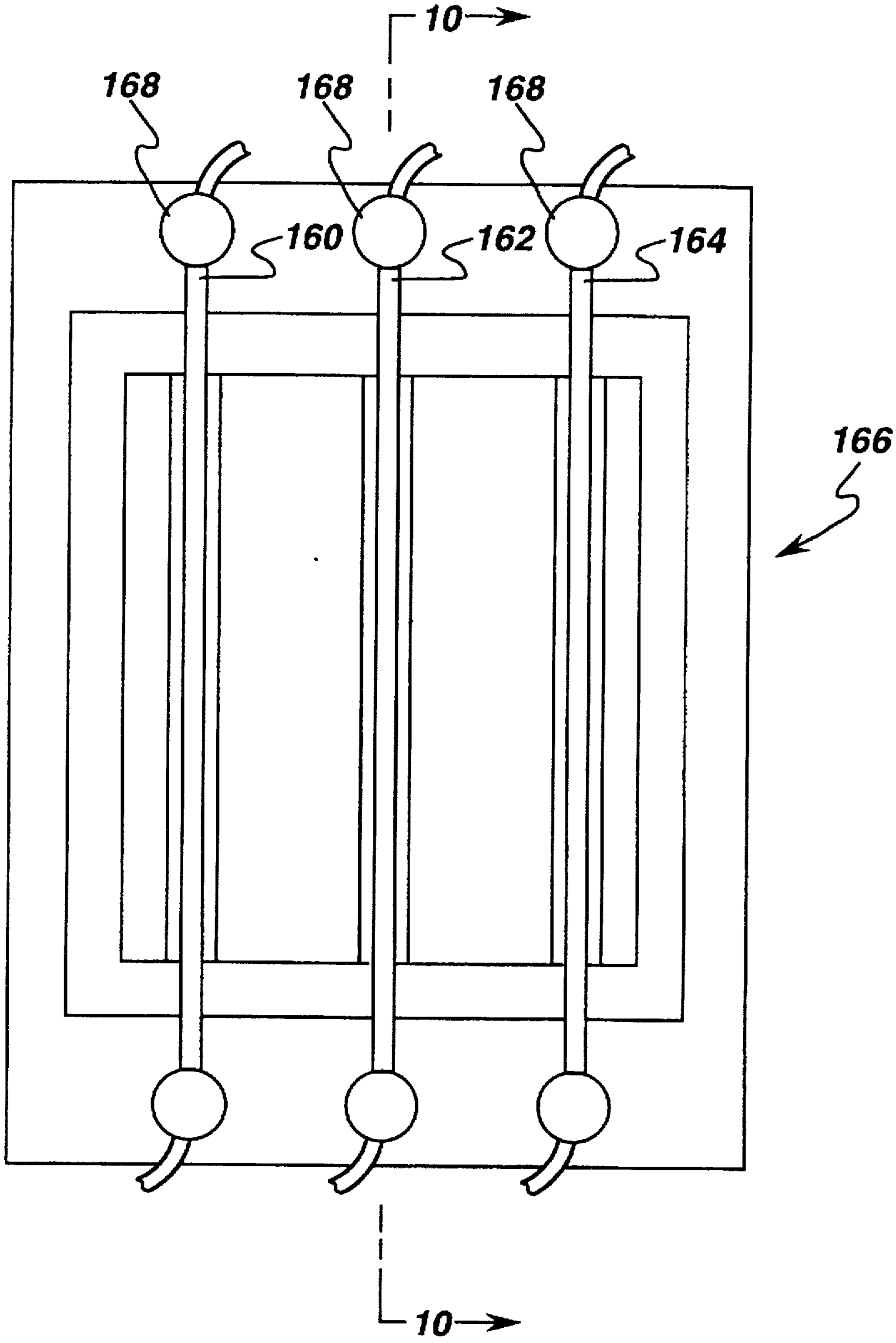
FIG. 9 is a top plan view of the body of FIG. 8 positioned in a fixture.
Figure 10:
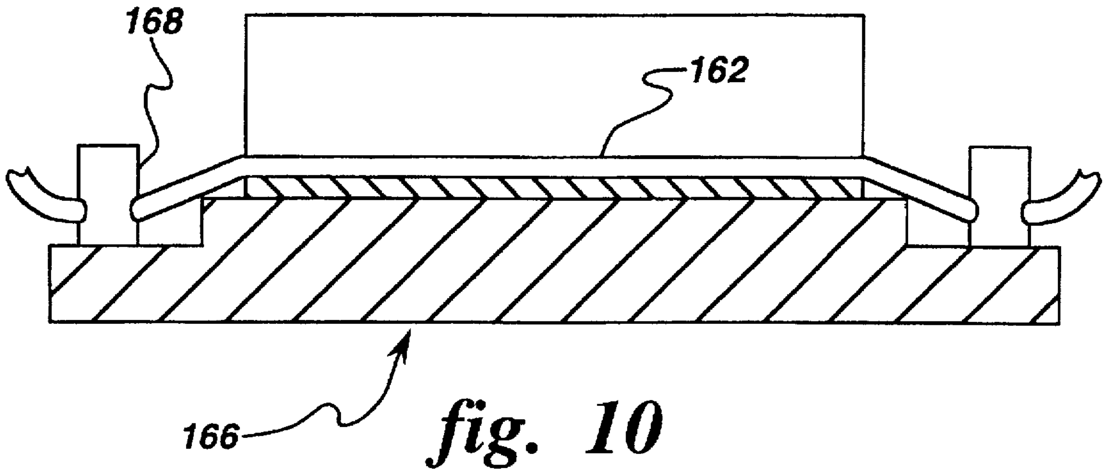
FIG. 10 is a cross-sectional view taken along line 10—10 of FIG. 9.

FIGS. 8, 9, 10 and 11 depict an alternative approach employing masking to pattern the buried signal electrode access conductors. In particular, as shown in FIGS. 8, 9 and 10, suitably-supported masking wires 160, 162 and 164 are placed in the bottom of slots 36, 38 and 40, respectively, prior to metallization. A suitable fixture 166 includes set screws 168, to hold tightly wires 160, 162 and 164.

Figure 11:
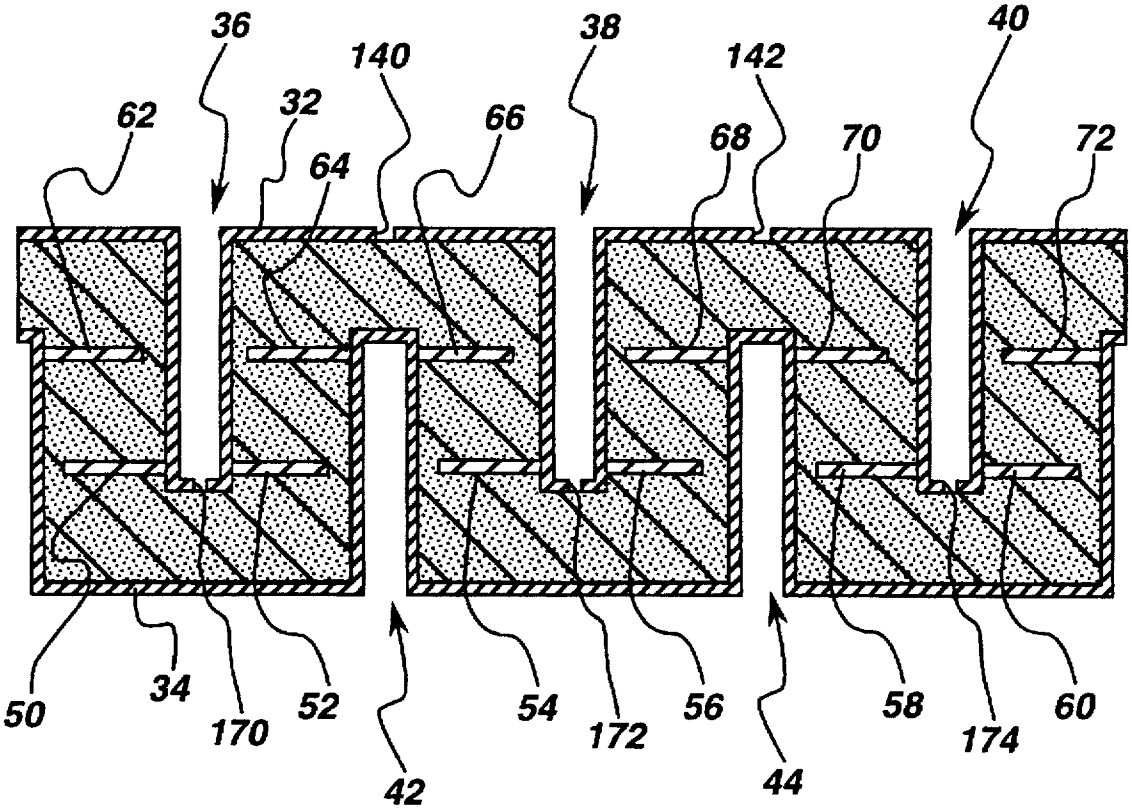
FIG. 11 depicts, in cross-section, the body of FIG. 8 after metallization and removal of the masking wires.

After metallization, generally comparable to that of FIG. 5, wires 160, 162 and 164 are removed, resulting in the structure of FIG. 11 wherein corresponding metallization gaps 170, 172 and 174 remain in the bottoms of slots 36, 38 and 40 to achieve the required isolation. Gaps 140 and 142 in signal electrode layer 32 may be produced with a dicing saw as described hereinabove with reference to FIGS. 6 and 7, or by employing a photolithographic process.

While only certain preferred features of the invention have been illustrated and described, many modifications and changes will occur to those skilled in the art. It is, therefore, to be understood that the appended claims are intended to cover all such modifications and changes as fall within the true spirit of the invention.

What is claimed is:

1. A method of manufacturing an array of multilayer ultrasonic transducer elements, said method comprising:
   providing a body of piezoelectric material having two major surfaces and an internal buried conductor layer structure, the internal buried conductor layer structure including at least one ground conductor layer comprising a set of generally planar buried ground electrode precursors extending in a first coordinate direction and spaced in a second coordinate direction, and at least one signal conductor layer comprising a set of generally planar buried signal electrode precursors extending in the first coordinate direction and spaced in the second coordinate direction, the buried signal electrode precursors being staggered in the second coordinate direction with reference to the buried ground electrode precursors such that intermediate regions of the buried signal electrode precursors are in alignment with spaces between the buried ground electrode precursors and intermediate regions of the buried ground electrode precursors are in alignment with spaces between the buried signal electrode precursors;
   forming a first set of partial depth row isolation slots extending from one of the major surfaces into the body in alignment with spaces between buried ground electrode precursors and intersecting buried signal electrode precursors to define buried signal electrode portions, and a second set of partial depth row isolation slots extending from the other of the major surfaces into the body in alignment with spaces between buried signal electrode precursors and intersecting buried ground electrode precursors to define buried ground electrode portions; and
   forming a signal electrode layer on the one of the major surfaces and buried signal electrode access conductors within the first set of row isolation slots to electrically connect the buried signal electrodes to the signal electrode layer, and forming a ground electrode layer on the other of the major surfaces and buried ground electrode access conductors within the second set of row isolation slots extending from the other major surface to electrically connect the buried ground electrodes to the ground electrode layer.

2. The method of claim 1, wherein the signal electrode layer is patterned to define isolated row signal electrodes, and at least some of the buried signal electrode access conductors are patterned to electrically isolate the buried signal electrode portions on opposite sides of the row isolation slots of the first set.

3. The method of claim 2, which comprises employing a dicing saw to pattern the signal electrode layer and the buried signal electrode access conductors.

4. The method of claim 2, which comprises employing a string saw to pattern the buried signal electrode access conductors.

5. The method of claim 2, which comprises placing a wire in the bottom of at least one of the row isolation slots extending from the one major surface to serve as a mask, depositing metallization, and then removing the wire to form patterned buried signal electrode access conductors.

6. The method of claim 1, which further comprises dicing the body in the second coordinate direction to define a plurality of individual elements in each row.

7. A method of manufacturing an array of multilayer ultrasonic transducer elements, said method comprising:
   providing a body of piezoelectric material having two major surfaces and an internal buried conductor layer structure, the internal buried conductor layer structure including at least one ground conductor layer comprising a set of generally planar buried ground electrode precursors extending in a first coordinate direction and spaced in a second coordinate direction, and at least one signal conductor layer comprising a set of generally planar buried signal electrode precursors extending in the first coordinate direction and spaced in the second coordinate direction, the buried signal electrode precursors being staggered in the second coordinate direction with reference to the buried ground electrode precursors such that intermediate regions of the buried signal electrode precursors are in alignment with spaces between the buried ground electrode precursors and intermediate regions of the buried ground electrode precursors are in alignment with spaces between the buried signal electrode precursors;
   forming at least one partial depth row isolation slot extending from one of the major surfaces into the body in alignment with spaces between buried ground electrode precursors and intersecting buried signal electrode precursors to define buried signal electrode portions, and at least one partial depth row isolation slot extending from the other of the major surfaces into the body in alignment with spaces between buried signal electrode precursors and intersecting buried ground electrode precursors to define buried ground electrode portions; and
   forming a signal electrode layer on the one of the major surfaces and buried signal electrode access conductors within the at least one row isolation slot extending from the one major surface to electrically connect the buried signal electrodes to the signal electrode layer, and forming a ground electrode layer on the other of the major surfaces and buried ground electrode access conductors within the at least one row isolation slot extending from the other of the major surfaces to electrically connect the buried ground electrodes to the ground electrode layer.

8. The method of claim 7, wherein the signal electrode layer is patterned to define isolated row signal electrodes, and at least some of the buried signal electrode access conductors are patterned to electrically isolate the buried signal electrode portions on opposite sides of the row isolation slots of the first set.

9. The method of claim 8, which comprises employing a dicing saw to pattern the signal electrode layer and the buried signal electrode access conductors.

10. The method of claim 8, which comprises employing a string saw to pattern the buried signal electrode access conductors.

11. The method of claim 8, which comprises placing a wire in the bottom of the at least one row isolation slot extending from the one major surface to serve as a mask, depositing metallization, and then removing the wire to form patterned buried signal electrode access conductors.

12. The method of claim 7, which further comprises dicing the body in the second coordinate direction to define a plurality of individual elements in each row.

* * * * *